US009506145B2

(12) United States Patent
Baluja et al.

(10) Patent No.: US 9,506,145 B2
(45) Date of Patent: Nov. 29, 2016

(54) METHOD AND HARDWARE FOR CLEANING UV CHAMBERS

(71) Applicant: Applied Materials, Inc., Santa Clara, CA (US)

(72) Inventors: Sanjeev Baluja, Campbell, CA (US); Alexandros T. Demos, Fremont, CA (US); Kelvin Chan, San Ramon, CA (US); Juan Carlos Rocha-Alvarez, San Carlos, CA (US); Scott A. Hendrickson, Brentwood, CA (US); Abhijit Kangude, Mountain View, CA (US); Inna Turevsky, Santa Clara, CA (US); Mahendra Chhabra, San Jose, CA (US); Thomas Nowak, Cupertino, CA (US); Daping Yao, Portland, OR (US); Bo Xie, San Jose, CA (US); Daemian Raj, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/180,514

(22) Filed: Jun. 13, 2016

(65) Prior Publication Data

US 2016/0296981 A1    Oct. 13, 2016

Related U.S. Application Data

(62) Division of application No. 13/970,176, filed on Aug. 19, 2013, now Pat. No. 9,364,871.

(60) Provisional application No. 61/692,674, filed on Aug. 23, 2012.

(51) Int. Cl.
*H01L 21/00*   (2006.01)
*C23C 16/44*   (2006.01)
(Continued)

(52) U.S. Cl.
CPC ..... *C23C 16/4405* (2013.01); *C23C 16/45565* (2013.01); *C23C 16/482* (2013.01)

(58) Field of Classification Search
None
See application file for complete search history.

(56) References Cited

U.S. PATENT DOCUMENTS

| 5,997,649 A | 12/1999 | Hillman |
| 6,182,603 B1 | 2/2001 | Shang et al. |

(Continued)

FOREIGN PATENT DOCUMENTS

| KR | 10-1999-0010957 | 2/1999 |
| KR | 10-2011-0093251 | 8/2011 |

OTHER PUBLICATIONS

PCT Notification of Transmittal of the International Search Report and the Written Opinion of the International Searching Authority for International Application No. PCT/US2013/055594; dated Aug. 27, 2014; 11 total pages.

*Primary Examiner* — Michael Kornakov
*Assistant Examiner* — Ryan Coleman
(74) *Attorney, Agent, or Firm* — Patterson & Sheridan, LLP

(57) ABSTRACT

A cleaning method for a UV chamber involves providing a first cleaning gas, a second cleaning gas, and a purge gas to one or more openings in the chamber. The first cleaning gas may be an oxygen containing gas, such as ozone, to remove carbon residues. The second cleaning gas may be a remote plasma of $NF_3$ and $O_2$ to remove silicon residues. The UV chamber may have two UV transparent showerheads, which together with a UV window in the chamber lid, define a gas volume proximate the UV window and a distribution volume below the gas volume. A purge gas may be flowed through the gas volume while one or more of the cleaning gases is flowed into the distribution volume to prevent the cleaning gases from impinging on the UV transparent window.

20 Claims, 3 Drawing Sheets

(51) Int. Cl.
*C23C 16/48* (2006.01)
*C23C 16/455* (2006.01)

(56) References Cited

U.S. PATENT DOCUMENTS

| | | |
|---|---|---|
| 2004/0026372 A1 | 2/2004 | Takenaka et al. |
| 2006/0196525 A1* | 9/2006 | Vrtis .................. C23C 16/4405 134/1 |
| 2007/0256635 A1 | 11/2007 | Bour et al. |
| 2008/0078744 A1 | 4/2008 | Wang et al. |
| 2008/0127895 A1 | 6/2008 | Shao et al. |
| 2008/0317975 A1 | 12/2008 | Furui et al. |
| 2010/0065758 A1 | 3/2010 | Liu et al. |
| 2011/0201134 A1 | 8/2011 | Hoffman et al. |
| 2012/0132618 A1 | 5/2012 | Baluja et al. |

* cited by examiner

METHOD AND HARDWARE FOR CLEANING UV CHAMBERS

CROSS-REFERENCE TO RELATED APPLICATIONS

This application is a divisional application of co-pending U.S. patent application Ser. No. 13/970,176, filed on Aug. 19, 2013, which claims benefit of U.S. Provisional Patent Application Ser. No. 61/692,674 filed Aug. 23, 2012. Each of afore mentioned patent applications are incorporated herein by reference.

FIELD

Embodiments described herein generally relate to methods and apparatus for recovering dielectric constant of a low dielectric constant material. A chamber having two UV transparent gas distribution showerheads is described that allows cleaning of silicon and carbon residues without affecting a UV window in the chamber lid.

BACKGROUND

As the size of the electronic devices is reduced, new materials with a low dielectric constant (k), such as materials with dielectric value as low as 2.2, are used in forming the electronic devices.

Plasma-deposited porous low k films are one class of materials that is able to satisfy such a requirement. The presence of pores and carbon, which contributes to low dielectric value, creates significant process integration challenges since the pores are susceptible to etching, ashing, and plasma damages. Therefore, a k-restoration process is usually needed to restore the porous low-k films after formation and/or after integration.

Traditionally, two different chambers are needed for k-restoration. One chamber for chemical treatment of the low-k films, such as silylation, or deposition of a thin film for surface treatment of the low-k films. A different chamber is used for pore sealing using UV (ultra violet) curing. Traditional k-restoration is performed in separate chambers because the chemical surface treatment uses a showerhead to supply a processing gas including halogen or ozone while the UV chamber uses a quartz window which usually is not compatible with halogen and ozone. However, the two chamber k-restoration process increases cost of ownership by requiring two chambers and additional time for substrate transfer.

Therefore, there is a need for an improved apparatus and method for k-restoration processes.

SUMMARY

Embodiments disclosed herein generally relate to methods and apparatus for processing substrates. A process chamber features a first UV transparent showerhead and a second UV transparent showerhead. A UV transparent window is positioned above the showerheads. The UV transparent window and the first UV transparent showerhead together define a gas volume, and the first UV transparent showerhead and the second UV transparent showerhead together define a distribution volume. Gas openings in the chamber side wall or lid provide a flow pathway for process gases into the gas volume and/or the distribution volume. Process gases flow through the first and second UV transparent showerheads into a space proximate to a substrate support.

A cleaning method for such a chamber involves providing a first cleaning gas, a second cleaning gas, and a purge gas to one or more openings in the chamber. The first cleaning gas may be an oxygen containing gas, such as ozone, to remove carbon residues. A second cleaning gas may be a remote plasma of $NF_3$ and $O_2$ to remove silicon residues. A purge gas may be flowed through the gas volume while one or more of the cleaning gases is flowed into the distribution volume to prevent the cleaning gases from impinging on the UV transparent window.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other effective embodiments.

DETAILED DESCRIPTION

Figure 1:
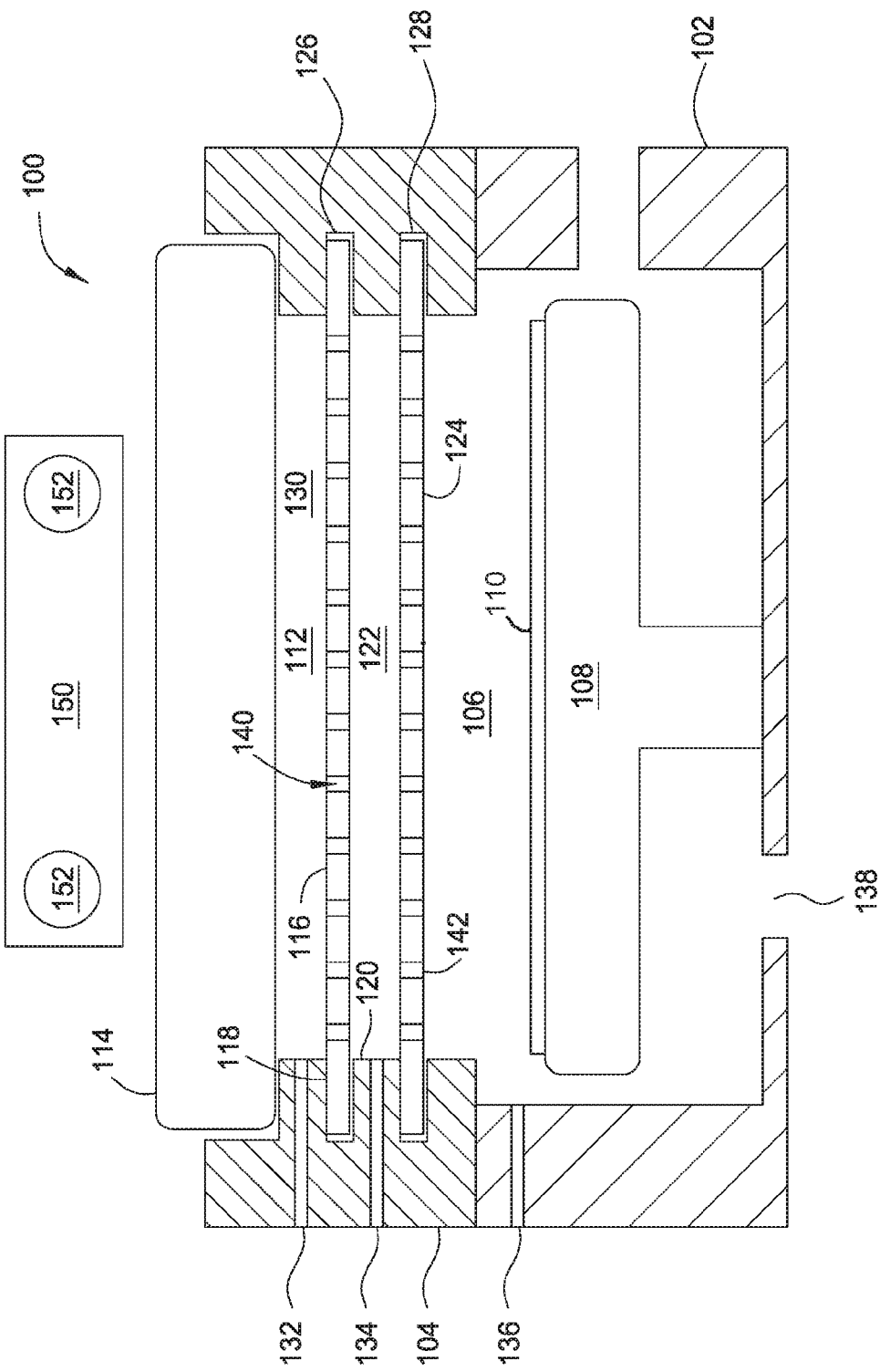
FIG. 1 is a schematic sectional view of a process chamber 100 according to one embodiment.

FIG. 1 is a schematic sectional view of a processing chamber 100 according to one embodiment. The processing chamber 100 is configured to process a substrate using UV energy, one or more processing gases, and remotely generated plasma.

The processing chamber 100 includes a chamber body 102 and a chamber lid 104 disposed over the chamber body. The chamber body 102 and the chamber lid 104 form an inner volume 106. A substrate support assembly 108 is disposed in the inner volume 106. The substrate support assembly 108 receives and supports a substrate 110 thereon for processing.

A first UV transparent gas distribution showerhead 116 is hung in the inner volume 106 through a central opening 112 of the chamber lid 104 by an upper clamping member 118 and a lower clamping member 120. The UV transparent gas distribution showerhead 116 is positioned facing the substrate support assembly 108 to distribute one or more processing gases across a distribution volume 122 which is below the first UV transparent gas distribution showerhead 116. A second UV transparent showerhead 124 is hung in the inner volume 106 through the central opening 112 of the chamber lid 104 below the first UV transparent gas distribution showerhead 116. Each of the UV transparent gas distribution showerheads 116 and 124 is disposed in a recess formed in the chamber lid 104. A first recess 126 is an annular recess around an internal surface of the chamber lid 104, and the first UV transparent gas distribution showerhead 116 fits into the first recess 126. Likewise, a second recess 128 receives the second UV transparent gas distribution showerhead 124.

A UV transparent window 114 is disposed above the first UV transparent gas distribution showerhead 116. The UV transparent window 114 is positioned above the first UV transparent gas distribution showerhead 116 forming a gas volume 130 between the UV transparent window 114 and the first UV transparent gas distribution showerhead 116. The UV transparent window 114 may be secured to the chamber lid 104 by any convenient means, such as clamps, screws, or bolts.

The UV transparent window 114 and the first and second UV transparent gas distribution showerheads 116 and 124 are at least partially transparent to thermal or radiant energy within the UV wavelengths. The UV transparent window 114 may be quartz or another UV transparent silicon material, such as sapphire, $CaF_2$, $MgF_2$, AlON, a silicon oxide or silicon oxynitride material, or another transparent material.

A UV source 150 is disposed above the UV transparent window 114. The UV source 150 is configured to generate UV energy and project the UV energy towards the substrate support 108 through the UV transparent window 114, the first UV transparent gas distribution showerhead 116, and the second UV transparent gas distribution showerhead 124. A cover (not shown) may be disposed above the UV source 150. In one embodiment, the cover may be shaped to assist projection of the UV energy from the UV source 150 towards the substrate support.

In one embodiment, the UV source 150 includes one or more UV lights 152 to generate UV radiation. The UV lights may be lamps, LED emitters, or other UV emitters. More detailed descriptions of suitable UV sources can be found in U.S. Pat. No. 7,777,198, and United States Patent Publication 2006/0249175.

The processing chamber 100 includes flow channels configured to supply one or more processing gases across the substrate support 108 to process a substrate disposed thereon. A first flow channel 132 provides a flow pathway for gas to enter the gas volume 130 and to be exposed to UV radiation from the UV source 150. The gas from the gas volume 130 may flow through the first UV transparent gas distribution showerhead 116 into the distribution volume 122. A second flow channel 134 provides a flow pathway for gas to enter the distribution volume 122 directly without passing through the first UV transparent gas distribution showerhead 116 to mix with the gas that was previously exposed to UV radiation in the gas volume 130. The mixed gases in the distribution volume 122 are further exposed to UV radiation through the first UV transparent gas distribution showerhead 116 before flowing through the second UV transparent gas distribution showerhead 124 into a space proximate the substrate support 108. The gas proximate the substrate support 108, and a substrate disposed on the substrate support 108, is further exposed to the UV radiation through the second UV transparent gas distribution showerhead 124. Gases may be exhausted through the opening 136. Purge gases may be provided through the opening 138 in the bottom of the chamber, such that the purge gases flow around the substrate support 108, effectively preventing intrusion of process gases into the space under the substrate support.

The first UV transparent gas distribution showerhead 116 includes a plurality of through holes 140 that allow processing gas to flow from the gas volume 130 to the distribution volume 122. The second UV transparent gas distribution showerhead 124 also includes a plurality of through holes 142 that allow processing gas to flow from the distribution volume 122 into the processing space proximate the substrate support 108. The through holes in the first and second gas UV transparent gas distribution showerheads may be evenly distributed with the same spacing or different spacing.

Figure 2A:
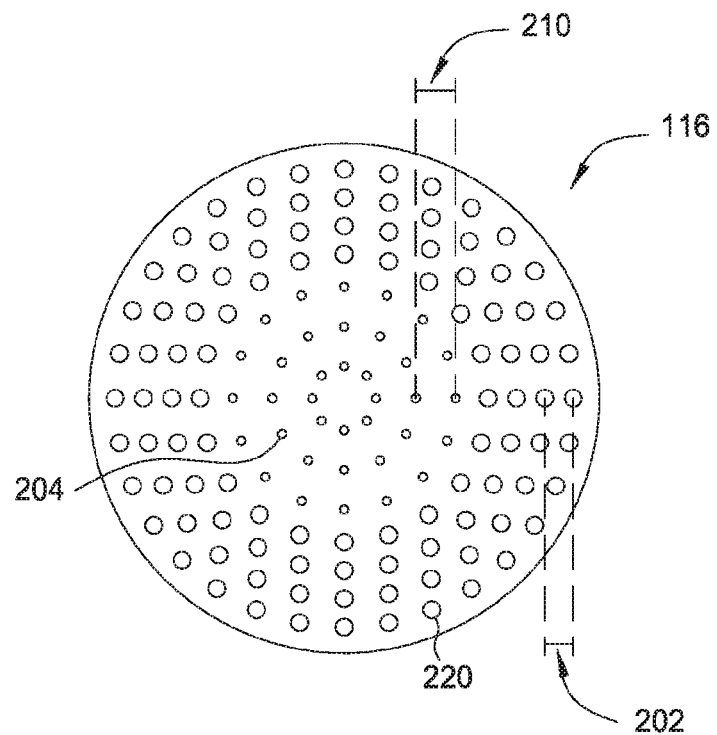
FIG. 2A is a plan view of a UV transparent gas distribution showerhead according to one embodiment.

FIG. 2A is a plan view of the first UV transparent gas distribution showerhead 116. The first showerhead 116 may comprise a first plurality of through holes 202 arranged toward a periphery of the first showerhead 116 and a second plurality of through holes 204 arranged toward a center region of the first showerhead 116. The first plurality of through holes 202 and the second plurality of through holes 204 may be arranged in concentric ranks. In the embodiment of FIG. 2A, the through holes 202 at the periphery of the showerhead 116 have a diameter that is larger than the holes 204 at the central region of the showerhead 116. In one embodiment, the holes 202 have a diameter between about 0.020 inches and about 0.050 inches, for example about 0.030 inches, and the holes 204 have a diameter between about 0.010 inches and about 0.030 inches, for example about 0.020 inches. The holes 202 have a first spacing 220, and the holes 204 have a second spacing 210. In the embodiment of FIG. 2A, the spacing 210 is larger than the spacing 220. In the embodiment of FIG. 2A, the hole size and spacing promotes faster flow through the showerhead 116 in the peripheral region thereof to promote contact of cleaning gases with chamber walls.

Figure 2B:
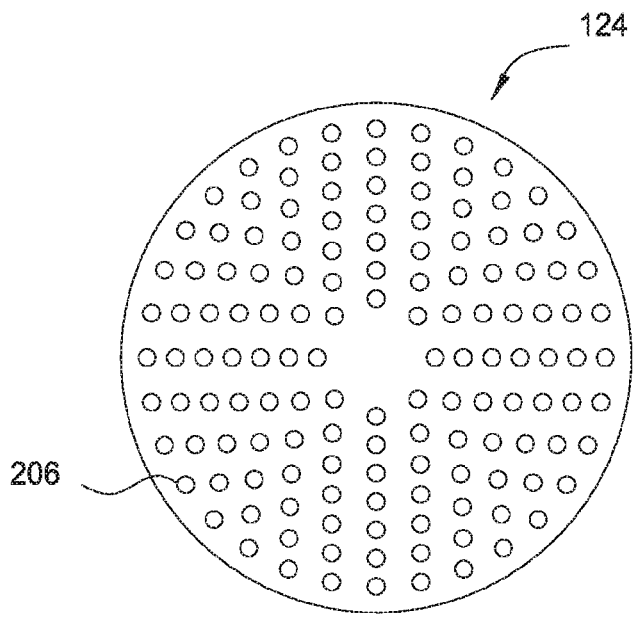
FIG. 2B is a plan view of a UV transparent gas distribution showerhead according to another embodiment.

FIG. 2B is a plan view of the second UV transparent gas distribution showerhead 124. The showerhead 124 may comprise a plurality of through holes 206 with uniform size and spacing to promote uniform flow through the showerhead 124. The through holes 206 may have a diameter of between about 0.020 inches and about 0.050 inches, for example about 0.030 inches.

Figure 2C:
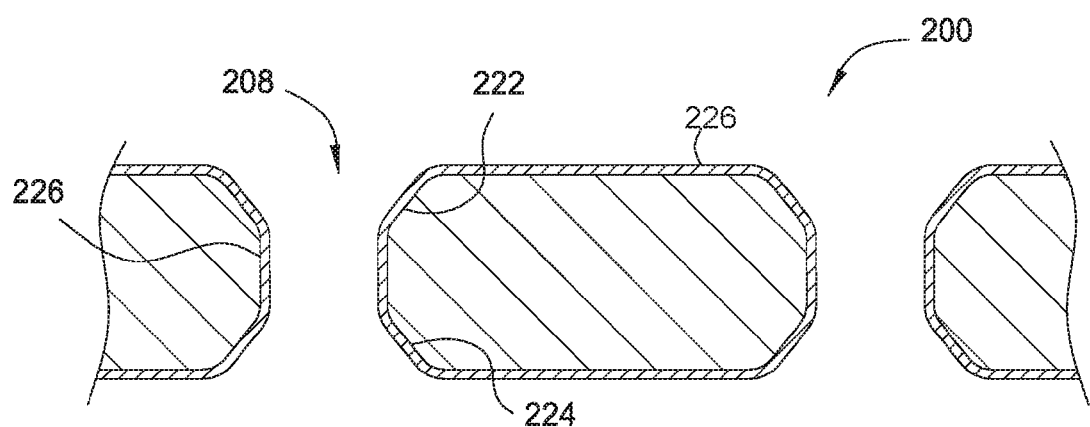
FIG. 2C is a detailed cross-sectional view of a UV transparent gas distribution showerhead according to another embodiment.

FIG. 2C is a detailed cross-sectional view of a UV transparent gas distribution showerhead 200 having through holes 208 formed therein. The through holes 208 may be used as the through holes 140, 142, 202, and 204, and the plate 200 may be used as the plate 116 or 124. The through holes 208 have a tapered entry portion 222 and a tapered exit portion 224. A coating 226 is disposed over all exposed surfaces of the plate 200. The coating 226 may be a fluorine-resistant coating, such as sapphire, $CaF_2$, $MgF_2$, AlON, or other fluorine-resistant material, and is typically conformal. The coating may have a thickness between about 1 μm and about 10 μm, and may be deposited by a vapor deposition process, such as chemical vapor deposition, which may be plasma enhanced. The tapered entry portion 222 and the tapered exit portion 224 facilitate coating the entire surface of the through hole 208. IN the embodiment of FIG. 2C, both major surface of the plate 200 are coated. In an alternate embodiment, only one major surface of the plate 200 is coated. In such an embodiment, the through holes 208 may be entirely coated or only partially coated. In another alternate embodiment, the through holes 208 are tapered on only one side, the entry side or the exit side.

Figure 2D:
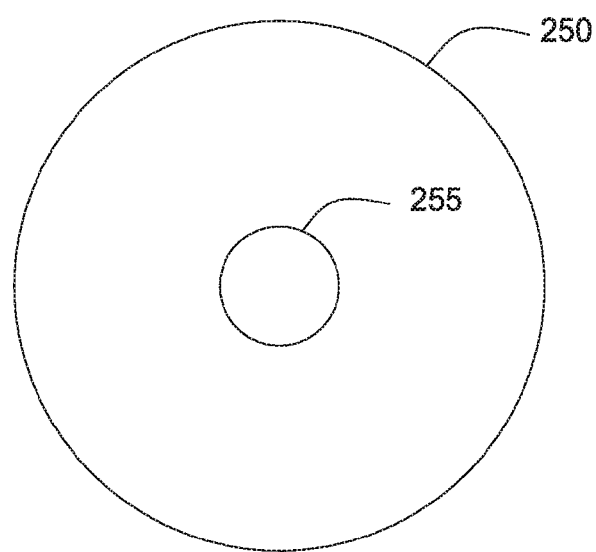
FIG. 2D is a plan view of a UV transparent gas distribution showerhead according to another embodiment.

FIG. 2D is a plan view of a second UV transparent gas distribution showerhead 250 according to another embodiment. The showerhead 250 may be used in the apparatus 100 of FIG. 1 as the showerhead 124. The showerhead 250 has a single large opening 255 in a central region of the showerhead 250. The opening 255 allows flow through the showerhead 250, and sizing of the opening 255 relative to a substrate to be processed in the chamber 100 (FIG. 1) promotes uniform processing of the substrate. For a 300 mm circular substrate, sizing the opening 255 at a diameter of about 0.5 inches allows uniform processing of substrates and thorough cleaning of chamber surfaces.

In operation, processing gases are provided to the gas volume 130 and the distribution volume 122 and pass through the showerheads 116 and 124 to perform a material operation on a substrate disposed on the substrate support 108. Residues of the process gases impinge on various chamber surfaces, such as the window 114, on a side facing the gas volume 130, either side of the showerheads 116 and 124, and the chamber walls. In one aspect the residues contain carbon and silicon.

A method of removing carbon and silicon residues from a chamber containing quartz or silicon oxide components, such as the chamber 100 with the UV transparent window 114, includes providing a first cleaning gas to the gas volume 130 and/or the distribution volume 122 through the openings 132 and 134. The first cleaning gas may comprise an oxygen containing gas, such as ozone ($O_3$) for removing carbon residues. The first cleaning gas may also be flowed through the opening 138 and around the substrate support 108, exiting through the exhaust opening 136, to remove carbon residue from the lower surfaces of the chamber 100. The UV source 150 may be activated during the cleaning process to promote formation of oxygen radicals from oxygen in the oxygen-containing gas, thus improving carbon removal.

A second cleaning gas may be provided to the chamber 100 to remove silicon and carbon residues concurrently. The second cleaning gas is selected to remove silicon residues while not reacting with silicon oxide components of the chamber 100, such as a quartz window 114. The second cleaning gas may be a fluorine-containing gas, which may be activated outside the processing chamber. In one example, the second cleaning gas is a remote plasma of $NF_3$ and $O_2$ containing oxygen radicals and fluorine radicals. The UV source may be activated during use of the second cleaning gas to promote formation of oxygen radicals and the break diatomic fluorine into fluorine radicals. The second cleaning gas may also be provided through the openings 132, 134, and 138, exhausting through the opening 136.

A purge gas, such as argon or helium, may be provided through the opening 132, instead of a cleaning gas. During a material operation, a purge gas may be provided through opening 132 while a precursor gas is provided through opening 134. The purge gas prevents deposition of process gases on the UV window 114 by confining the process gases to the distribution volume 122. During a cleaning operation, a purge gas may likewise be used in the gas volume 130 if cleaning is not required for the UV window 114. In another embodiment, purge gas may be provided through the openings 132 and 134, while a cleaning gas is provided through the opening 138 to perform a cleaning operation on lower surfaces of the chamber 100. In such an embodiment, the substrate support 108 may be moved to a position proximate the second recess 128 of the chamber lid 104 to promote energetic flow of purge gas around the edge of the substrate support 108 into the exhaust opening 136, effectively preventing cleaning gases from emerging into the space between the second showerhead 124 and the substrate support 108.

When a remote plasma of $NF_3$ and $O_2$ is used as the cleaning gas, the purge gas may be argon remote plasma. When used as a purge gas during cleaning, the argon plasma may be subjected to a high pressure drop when entering through the openings 132 and/or 134 to promote recombination of radicals, while the cleaning gas is subjected to a low pressure drop to promote radical longevity.

Table 1 contains a summary of a typical cleaning matrix, according to the methods described herein.

TABLE 1

| Treat | Clean Frequency | First Cleaning Step | Second Cleaning Step |
|---|---|---|---|
| Interval | Every substrate | Every substrate or multiple | Multiple substrates | Multiple substrates |
| Opening 132 | Helium | Helium | Argon | Argon |
| Opening 134 | Helium | $O_3$ | $NF_3/O_2$ RPS low conc. | Argon |
| Opening 138 | Helium | $O_3$ | $NF_3/O_2$ RPS low conc. | $NF_3/O_2$ RPS low conc. |
| UV Intensity | High | High | Low | Low |
| Spacing | Normal | Wide | Normal | Close |

While the foregoing is directed to embodiments of the present invention, other and further embodiments of the invention may be devised without departing from the basic scope thereof, and the scope thereof is determined by the claims that follow.

The invention claimed is:

1. A method of cleaning a process chamber having an interior space, comprising:
   providing a purge gas to a first portion of the interior space;
   providing a first cleaning gas to a second portion of the interior space, wherein the first portion of the interior space is separated from the second portion of the interior space by a first UV transparent showerhead;
   activating the first cleaning gas using ultraviolet (UV) radiation from UV lamps positioned outside the process chamber;
   providing a second cleaning gas to the second portion of the interior space, wherein the second cleaning gas is provided to the second portion of the interior space through a flow channel that allows gas to enter the second portion of the interior space without first flowing through the first portion of the interior space;
   flowing the first and second cleaning gases through a second UV transparent showerhead that separates the second portion of the interior space from a third portion of the interior space such that the first and second cleaning gases can remove contaminant material from surfaces of the process chamber; and
   exhausting the purge gas, the first cleaning gas, and the second cleaning gas through a side wall of the chamber.

2. The method of claim 1, wherein the first cleaning gas is an oxygen-containing gas and the second cleaning gas is a fluorine-containing gas.

3. The method of claim 2, wherein the second cleaning gas is a remote plasma.

4. The method of claim 3, wherein the second cleaning gas comprises $NF_3$ and $O_2$.

5. The method of claim 4, wherein the first cleaning gas comprises $O_3$.

6. The method of claim 5, wherein the purge gas flows from the first portion to the second portion to mix with the first cleaning gas and the second cleaning gas.

7. The method of claim 6, wherein the purge gas comprises helium or argon.

8. A method of cleaning surfaces of a process chamber, comprising:
   flowing a first gas to a gas volume inside of a process chamber;

exposing the first gas to UV radiation in the gas volume using UV lamps positioned outside the process chamber;

flowing the first gas to a distribution volume inside of the process chamber, wherein the first gas flows through a first UV transparent showerhead separating the gas volume and the distribution volume;

flowing a second gas into the distribution volume, wherein the second gas is provided to the distribution volume through a flow channel that allows gas to enter the distribution volume without first flowing through the gas volume;

exposing the first gas to the UV radiation in the distribution volume, wherein the UV radiation passes through the first UV transparent showerhead;

flowing the first and second gases to an inner volume inside of the process chamber such that the first and second gases can clean surfaces of the process chamber, wherein the first and second gases flow through a second UV transparent showerhead separating the distribution volume and the inner volume; and exposing the first gas to the UV radiation in the inner volume, wherein the UV radiation passes through the second UV transparent showerhead.

9. The method of claim 8, wherein when the second gas is flowed into the distribution volume, the second gas is mixed with the first gas to form a mixed gas.

10. The method of claim 9, wherein the mixed gas is exposed to the UV radiation in the distribution volume.

11. The method of claim 10, further comprising flowing the mixed gas to the inner volume.

12. The method of claim 11, wherein the mixed gas is exposed to the UV radiation.

13. The method of claim 8, wherein the first gas is flowed through the first UV transparent showerhead via a first plurality of through holes.

14. The method of claim 13, wherein the first gas is flowed through the second UV transparent showerhead via a second plurality of through holes.

15. A method of cleaning surfaces of a process chamber, comprising:

flowing a first gas to a gas volume inside of a process chamber;

exposing the first gas to UV radiation in the gas volume using UV lamps positioned outside the process chamber;

flowing the first gas to a distribution volume inside of the process chamber, wherein the first gas flows through a first UV transparent showerhead separating the gas volume and the distribution volume;

flowing a second gas into the distribution volume, wherein the second gas is provided to the distribution volume through a flow channel that allows gas to enter the distribution volume without first flowing through the gas volume;

exposing the first gas to the UV radiation in the distribution volume, wherein the UV radiation passes through the first UV transparent showerhead;

flowing the first and second gases to an inner volume inside of the process chamber such that the first and second gases can clean surfaces of the process chamber, wherein the first and second gases flow through a second UV transparent showerhead separating the distribution volume and the inner volume;

exposing the first gas to the UV radiation in the inner volume, wherein the UV radiation passes through the second UV transparent showerhead; and exhausting the first gas through a side wall of the process chamber.

16. The method of claim 15, wherein when the second gas is flowed into the distribution volume, the second gas is mixed with the first gas to form a mixed gas.

17. The method of claim 16, wherein the mixed gas is exposed to the UV radiation in the distribution volume.

18. The method of claim 17, further comprising flowing the mixed gas to the inner volume.

19. The method of claim 18, wherein the mixed gas is exposed to the UV radiation in the inner volume.

20. The method of claim 15, wherein the first gas is flowed through the first UV transparent showerhead via a first plurality of through holes, and the first gas is flowed through the second UV transparent showerhead via a second plurality of through holes.

* * * * *